United States Patent
Michael

[11] Patent Number: 6,035,066
[45] Date of Patent: *Mar. 7, 2000

[54] BOUNDARY TRACKING METHOD AND APPARATUS TO FIND LEADS

[75] Inventor: David J. Michael, Newton, Mass.

[73] Assignee: Cognex Corporation, Natick, Mass.

[ * ] Notice: This patent issued on a continued prosecution application filed under 37 CFR 1.53(d), and is subject to the twenty year patent term provisions of 35 U.S.C. 154(a)(2).

[21] Appl. No.: 08/458,908

[22] Filed: Jun. 2, 1995

[51] Int. Cl.$^7$ .................................. G06K 9/62
[52] U.S. Cl. ........................... 382/203; 382/286
[58] Field of Search .................. 382/199, 316, 382/145, 170, 203, 204, 270, 286; 356/376, 237.3; 348/87, 126

[56] References Cited

U.S. PATENT DOCUMENTS

| | | | |
|---|---|---|---|
| 4,240,750 | 12/1980 | Kurtz et al. | 356/394 |
| 4,347,964 | 9/1982 | Takasugi et al. | 228/4.5 |
| 4,421,410 | 12/1983 | Karasaki | 356/378 |
| 4,439,010 | 3/1984 | Doty | 350/174 |
| 4,441,248 | 4/1984 | Sherman et al. | 29/574 |
| 4,490,848 | 12/1984 | Beall et al. | 382/121 |
| 4,799,175 | 1/1989 | Sano et al. | 364/552 |
| 4,847,911 | 7/1989 | Morimoto et al. | 382/8 |
| 4,855,928 | 8/1989 | Yamanaka | 364/489 |
| 4,981,372 | 1/1991 | Morimoto et al. | 382/8 |
| 5,138,180 | 8/1992 | Yamanaka | 250/561 |
| 5,156,319 | 10/1992 | Shibasaka et al. | 228/9 |
| 5,170,062 | 12/1992 | Miyshara | 250/561 |
| 5,225,891 | 7/1993 | Choumei | 356/376 |
| 5,412,742 | 5/1995 | Takasaki et al. | 382/203 |
| 5,434,927 | 7/1995 | Brady et al. | 382/199 |
| 5,500,737 | 3/1996 | Donaldson et al. | 356/376 |
| 5,532,739 | 7/1996 | Garakani et al. | 382/150 |
| 5,548,326 | 8/1996 | Michael | 348/87 |
| 5,586,199 | 12/1996 | Kanda et al. | 382/197 |
| 5,640,199 | 6/1997 | Garakani et al. | 348/87 |

*Primary Examiner*—Andrew W. Johns
*Attorney, Agent, or Firm*—Maureen Stretch; Russ Weinzimmer

[57] ABSTRACT

A system to find wirebonded leads by obtaining an image of the crescent formed on a lead after wire bonding, or a difference image (taken from an image of the lead before bonding and the crescent and wire formed after bonding) to create an intermediate image having the desired rotation and registration characteristics. Using a caliper or other wire-finding tool, the invention locates the wire and generates a threshold value for a boundary tracker that will make the located wire the expected width. An alternative preferred embodiment uses the gray value of an edge of the wire as the threshold. An optional artificial boundary is created as a limit for a boundary tracker. The invention then applies a boundary tracker to the intermediate image using the threshold value generated and any artificial boundary created. It then applies a corner finder that restricts starting corner orientations and analyzes the boundary and its features to find crescent tips and extrema to obtain measurements for inspection.

12 Claims, 6 Drawing Sheets

BOUNDARY TRACKING METHOD AND APPARATUS TO FIND LEADS

BACKGROUND OF THE INVENTION

This invention relates generally to the field of machine vision systems and particularly to automated visual inspection in the semiconductor manufacturing process.

Integrated circuit manufacturers generally want to improve the quality of their manufacturing and reduce their costs. In applications such as wire bonding of semiconductor integrated circuits inspection is used to help accomplish this.

A human inspector can only inspect on a sampled basis after bonding has taken place. Automatic inspection can inspect the bond while it is still on the wirebonder machine perhaps allowing feedback to the machine to improve its operating parameters or allowing immediate rework of the part. Automatic inspection can be run exhaustively on all parts being manufactured while human inspection is too expensive to do so.

There are no previously known solutions to the problem of inspecting the wire bonds on the lead frame side automatically. The bonds are currently inspected manually by a person using a microscope (typically on a sampled basis). Using a person to inspect leads manually is both slow and expensive. Inspecting leads on a sampled basis may allow poorly bonded devices to slip through.

Theoretically, previously known automated binary boundary tracking techniques, such as those shown in FIG. 4 might be applied. A binary boundary tracker follows a grey level contour in an image. As shown in FIG. 4, image pixels whose grey value are greater than a threshold are on one side of the contour, these are pixels inside the object 42. Image pixels whose grey value are less than or equal to the threshold are on the other side of the contour and these are shown as background pixels 46. The contour is one pixel wide and runs between these two regions of image pixels, shown in FIG. 4 by a number of boundary pixels 44. A difficulty in using a binary boundary tracker is choosing a correct threshold value. If the threshold is chosen too low, the contour will move in one direction and the contoured region will be too small. If the threshold is chosen too high, the contour will move in the other direction and the contoured region will be too large. Any measurements that are based on the contour may be incorrect if the threshold is chosen incorrectly.

It is an object of this invention to automatically measure the size of the solder bond crescent produced by a wire bonder (or similar machine) on the lead side from imagery.

It is another object to determine the presence or absence of a wire extending from the crescent in the direction of the semiconductor die.

SUMMARY OF THE INVENTION

These and other objects of the present invention are achieved by obtaining an image of the crescent formed on a lead after wire bonding, or a difference image (taken from an image of the lead before bonding and the crescent formed after bonding) to create an intermediate image having the desired rotation and registration characteristics. By the use of Applicant's co-pending U.S. patent application Ser. No. 08/367,478, Method and Apparatus for Aligning Oriented Objects, filed Jan. 3, 1995, which is hereby incorporated by reference, or another method, the invention locates the wire and uses a threshold value for a boundary tracker that will make the located wire the expected width. An alternative embodiment uses the gray value of an edge of the wire as the threshold. An optional artificial boundary is created as a limit for a boundary tracker. The invention then applies a boundary tracker to the intermediate image using the threshold value generated and any artificial boundary, if used. It then applies a corner finder that restricts starting corner orientations and analyzes the boundary and its features to find crescent tips and extrema to obtain measurements for inspection.

DETAILED DESCRIPTION OF THE INVENTION

Figure 1:
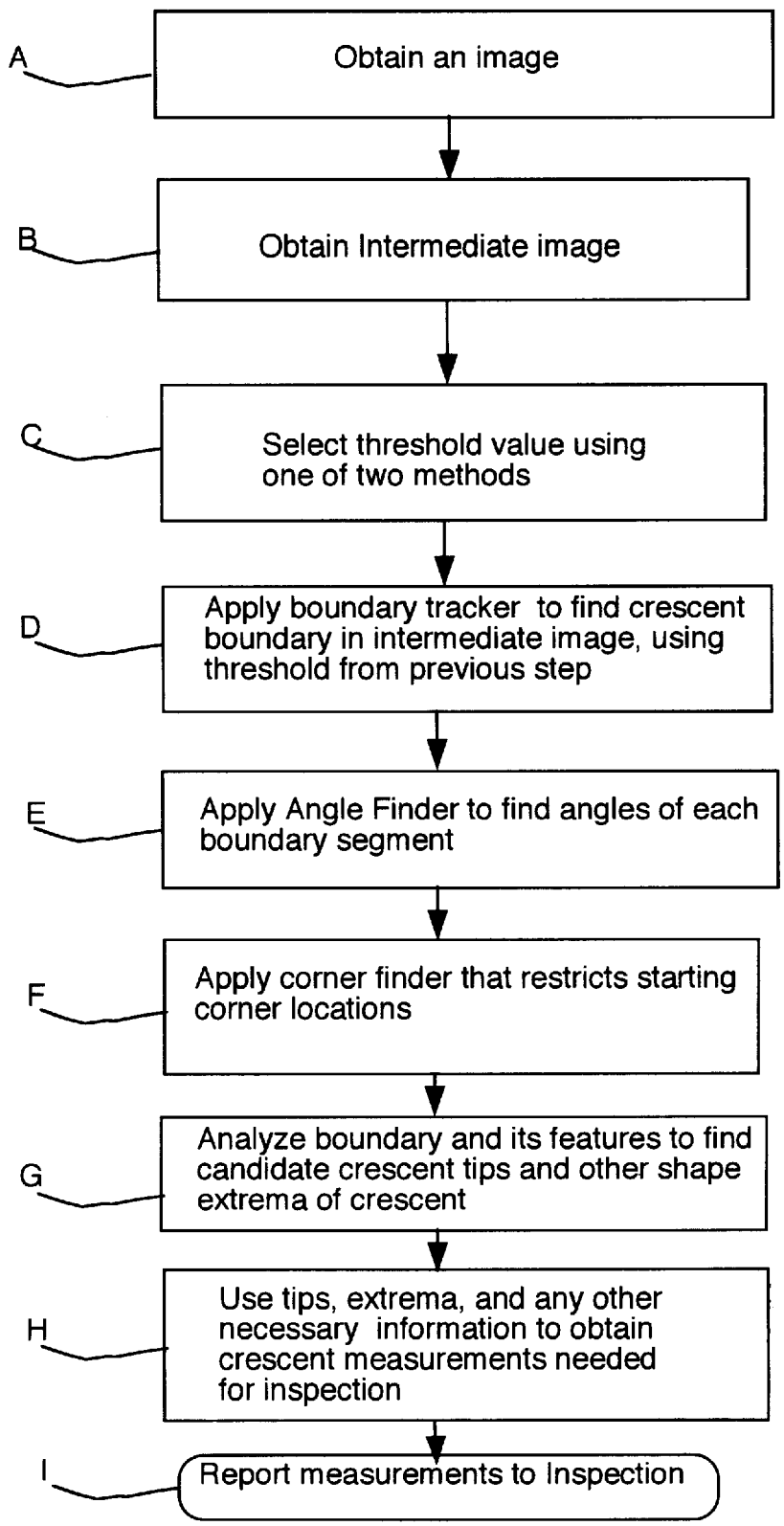
FIG. 1 is a flow diagram of the principal steps of the present invention.
Figure 5:
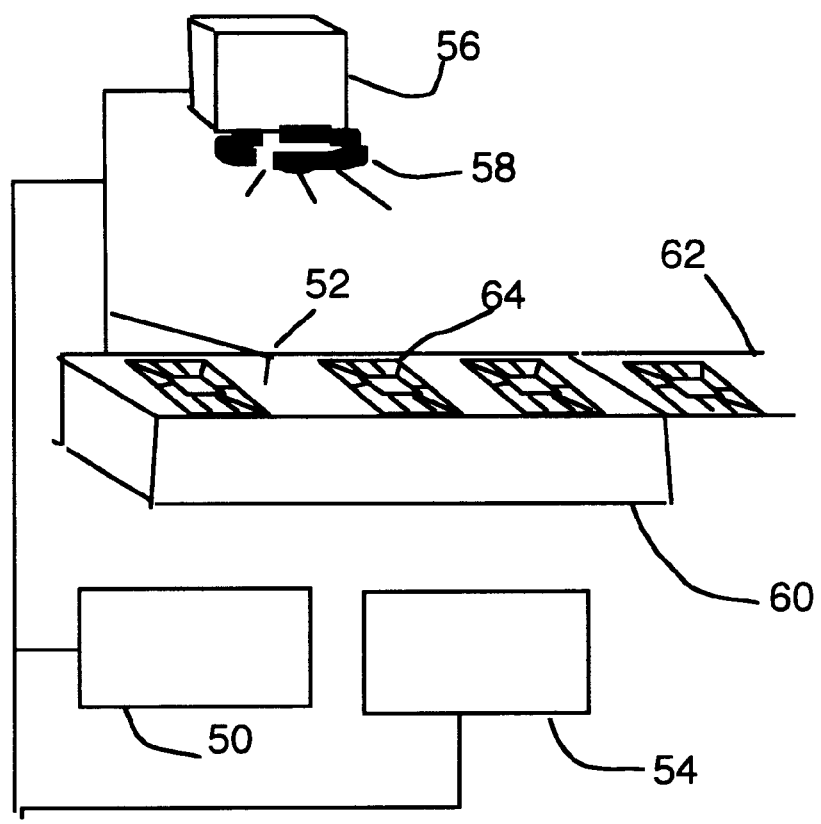
FIG. 5 is a perspective view of a wire bonding apparatus.

In FIG. 1, a flow diagram of the main elements of the present invention is shown. At Step A, in FIG. 1, an image is acquired. In a preferred embodiment, a vision processor 50, such as that shown in FIG. 5 is coupled to a bonding mechanism 52, a video camera 56, by table 60 a light means 58 and a host controller 54, to capture images of bonds formed between the leads on a lead frame 62 and a semiconductor chip 64. These images are digitized into grey scale representations of the devices imaged by video camera 56.

Figure 2:
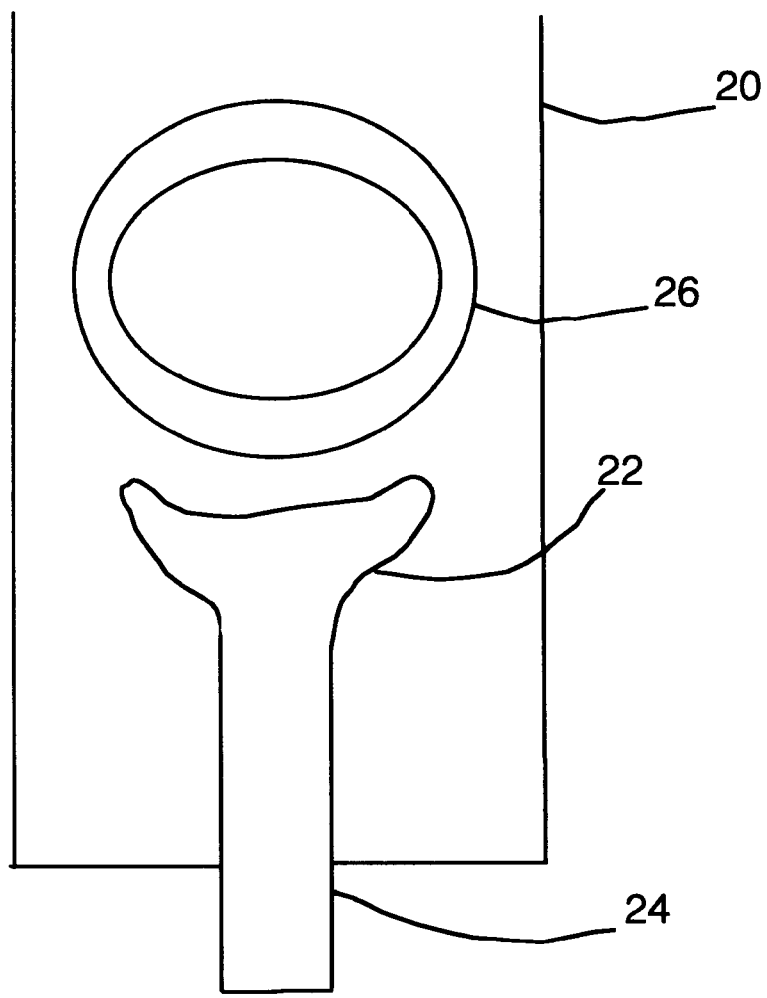
FIG. 2 is a top view of a wire bonded to a lead, with a crescent and an indentation.

In one preferred embodiment, the image acquired is simply a grey scale image of a bonded lead with a crescent, as shown in FIG. 2. In FIG. 2, the lead 20 is shown beneath a wire 24 which has been bonded to it. Crescent 22 is formed by the bonding mechanism.

In this embodiment of the present invention, the complete image as shown in FIG. 2 is used to create the intermediate image. Returning to FIG. 1, at Step A, this image can be rotated, in this preferred embodiment, using techniques described in Applicant's co-pending U.S. patent application Ser. No. 08/236,215 entitled Automated Third Optical Inspection using Nearest Neighbor Interpolation, filed May 2, 1994, now U.S. Pat. No. 5,640,199, and Efficient Image Registration, U.S. patent application Ser. No. 08/299,015, filed on Aug. 31, 1994, now U.S. Pat. No. 5,548,326, which are hereby incorporated by reference. Using a rotated image tends to improve the accuracy and speed of the measurement.

Figure 2A:
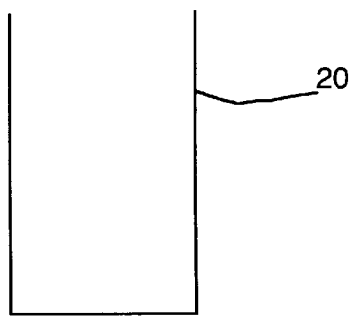
FIG. 2a is a top view of a lead before bonding.
Figure 2B:
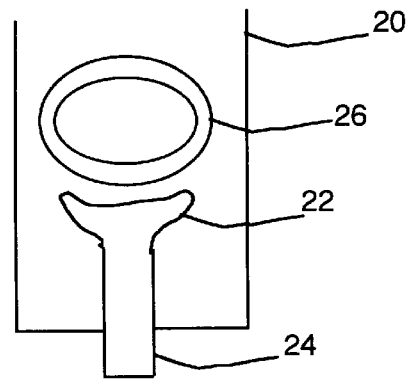
FIG. 2b is a top view of a lead after bonding, with a crescent and an indentation.
Figure 2C:
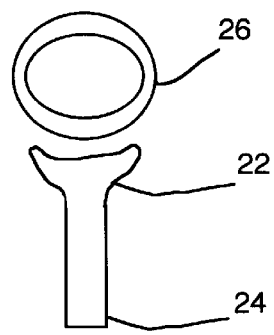
FIG. 2c is a top view of a difference image taken by subtracting the image of the lead before bonding and the image of the lead after bonding.

In another preferred embodiment, a difference image is created and used as the intermediate image. In this embodiment, Applicant's U.S. patent application Ser. No. 08/132,532, filed Oct. 6, 1993 entitled Automated Optical Inspection Apparatus (now abandoned) and the file wrapper continuation thereof, U.S. patent application 08/389,437 filed Feb. 15, 1995, now U.S. Pat. No. 5,532,739, of the same name which is hereby incorporated by reference, is used to create a pre-bond image of lead 20 as shown in FIG. 2*a*. After bonding has occurred, the post-bond image of the wire 24 bonded to lead 20 is created as depicted in FIG. 2*b*. Using the above referenced application, these two images are subtracted from each other to create a difference image as shown in FIG. 2*c*. As seen in FIG. 2*c*, this shows the wire 24, and the crescent 22, as well as the imprint of the indentation 26.

Because of mechanical drift in the stage, thermally-induced motion of the part being bonded, and bonding-induced motion of the part being bonded, it is impossible for the wire bonder to acquire (and to subsequently rotate) the second image at exactly the same location as that where the first image was acquired before bonding took place. Instead, the second image is acquired (and rotated) at a location as near as possible to the first image location and the precise registration of the two images is calculated using a registration technique described in Applicant's co-pending application Effective Image Registration.

The registration technique 1) calculates the exact subpixel translation between the first and second image and 2) produces a difference image shown in FIG. 2*c* whose pixels are the image grey value differences of the lead area before and after bonding. This difference image typically is empty—most of the pixels have values near 0—except where the wire bonding step effected change on the lead. If the wire bonding step is successful and produces a correct bond, these changes (non-zero pixels in the difference image) typically comprise a visible indentation 26 and crescent 22 with an emerging wire 24. Before inspection and analysis, the wire bonder knows the approximate location of the indentation and the approximate angles of the lead 20 and emerging wire 24.

In this preferred embodiment, the difference image of FIG. 2*c* is rotated as described above to create the intermediate image.

Returning now to FIG. 1, once an intermediate image has been created, the present invention next determines a threshold value to use for boundary tracking.

In one preferred embodiment, the present invention locates the wire, using the techniques described in Applicant's co-pending U.S. Patent Application Method and Apparatus for Aligning Oriented Objects, referenced above, or any other method available, and selecting a threshold value that makes the width of the wire the expected width of the object to be found by the boundary tracker.

Figure 4:
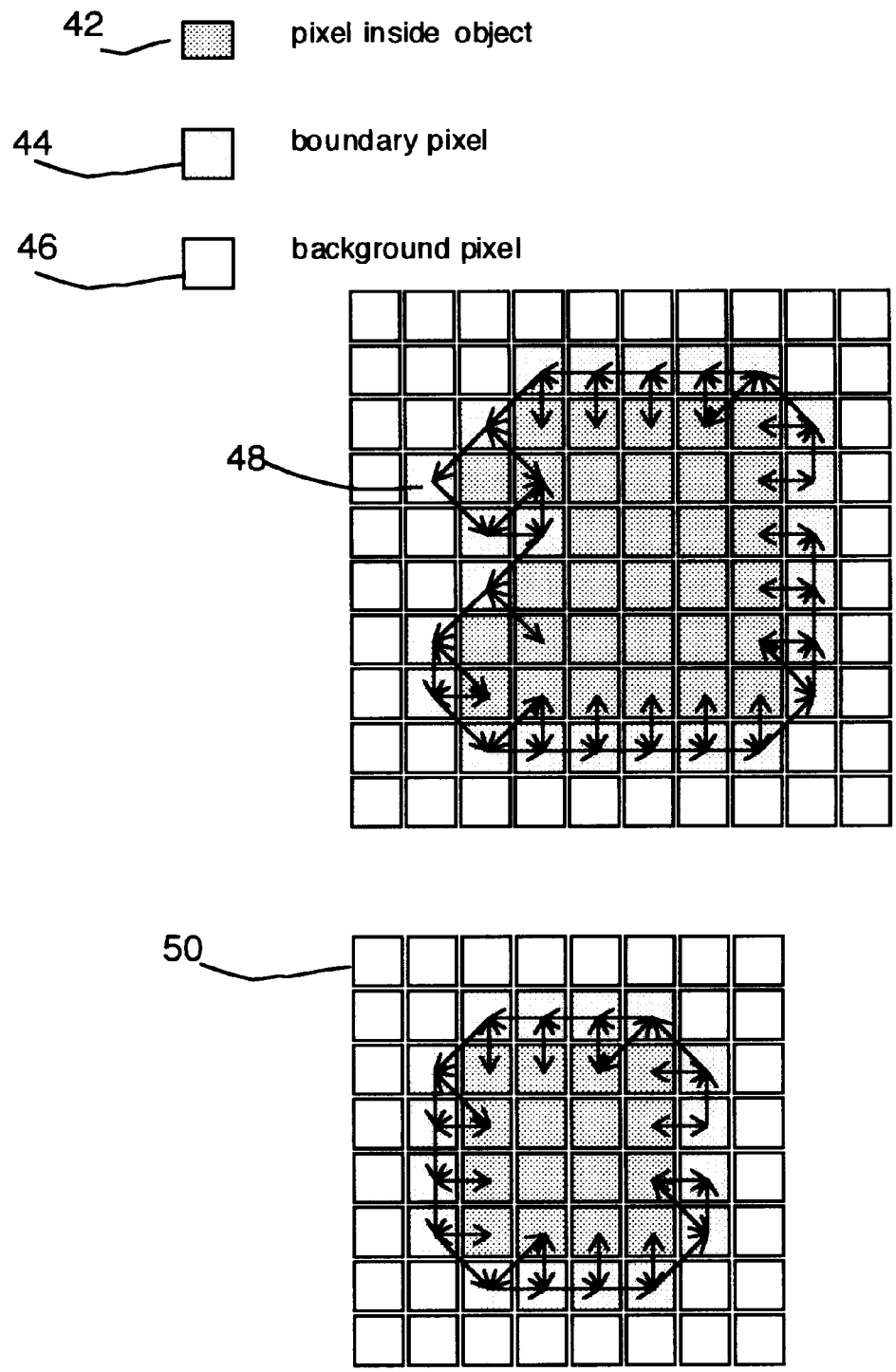
FIG. 4 is an illustrative view of a boundary tracker previously known in the art.

As will be apparent to those skilled in the art, a binary boundary tracker, follows a grey level contour in an image such as the one shown in FIG. 4. Image pixels whose grey value are greater then a threshold are on one side of the contour, as pixels inside the object 42. Image pixels whose grey value are less than or equal to the threshold are on the other side of the contour, shown here as background pixels 46. The contour is one pixel wide and runs between these two regions of image pixels, shown in FIG. 4 as boundary pixels 44. A difficulty in using a binary boundary tracker such as the one just described is choosing a correct threshold value. If the threshold is chosen too low, the contour will move in one direction and the contoured region will be too small. If the threshold is chosen too high, the contour will move in the other direction and the contoured region will be too large. Any measurements that are based on the contour may be incorrect if the threshold is chosen incorrectly.

Referring to FIG. 1, step C, the technique used to choose the correct threshold in one preferred embodiment of the present invention is to self-calibrate each threshold value for each difference image by measuring the size of a known object—in this case the diameter of the wire emerging from the crescent. The procedure is to 1) choose a starting threshold by looking at the image histogram where the emerging wire is supposed to be located and 2) to test and, if necessary, automatically adjust the threshold until the wire diameter is measured correctly. In the preferred embodiment, the Cognex VC-1 vision chip, described in U.S. Pat. No: 4,972,359 is used to do the image processing operations in a vision processor such as the one shown in FIG. 5 and to measure the wire 24. A technique such as that described in the above referenced Method and Apparatus for Aligning Oriented Objects patent application, or the Cognex Caliper tool, or similar tools provided by others, can be used to calculate the diameter of the wire 24. (See the above-referenced Method and Apparatus for Aligning Oriented Objects for an overview of the use of such a caliper tool.)

In one embodiment, the Cognex Vision Processor histograms data as it is being captured. The present invention starts with a histogram of a small window containing the image of the bonded wire (without the crescent.) It assumes there are only two "colors" of pixels, background and wire. Since the width of the wire is known and the size of the window is known, the invention reads off the grey value of the pixel in the histogram proportional to the width of the wire divided by the width of the window.

In a variation of this preferred embodiment of step C in FIG. 1, the invention starts with an initial guess based on the above histogram of the image or uses some other technique, such as a user-supplied value, to start. Next, it gives that value to the Caliper or caliper like tool to use directly (or it could binarize the image and give that binarized image to the Caliper or caliper-like tool) to measure the width. In this approach, the threshold is adjusted and given to Caliper iteratively until either the width is correct or some other stopping criteria is reached. The value that produces a correct width is used as the threshold.

A side effect of finding the correct threshold by measuring the wire width is to establish the location of the wire and confirm its presence. If the wire were not present, the wire bonding is faulty and the inspection does not need to proceed. If the wire is found, that information (absence/presence) and its location will be reported by the inspection system.

Figure 2D:
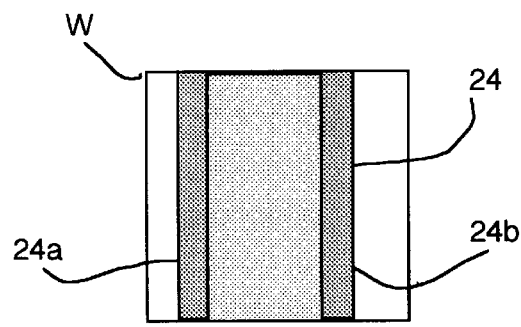
FIG. 2d is an image of a window showing gray values of a wire.

In another preferred embodiment of step C in FIG. 1, instead of calculating a threshold value based on the width of the wire, the present invention reads the grey value of the edges 24*a* and 24*b* of the wire, as shown in FIG. 2*d* which has been found by whichever means is used, and takes the average grey value of the edges as the threshold value for the boundary tracker.

Figure 3:
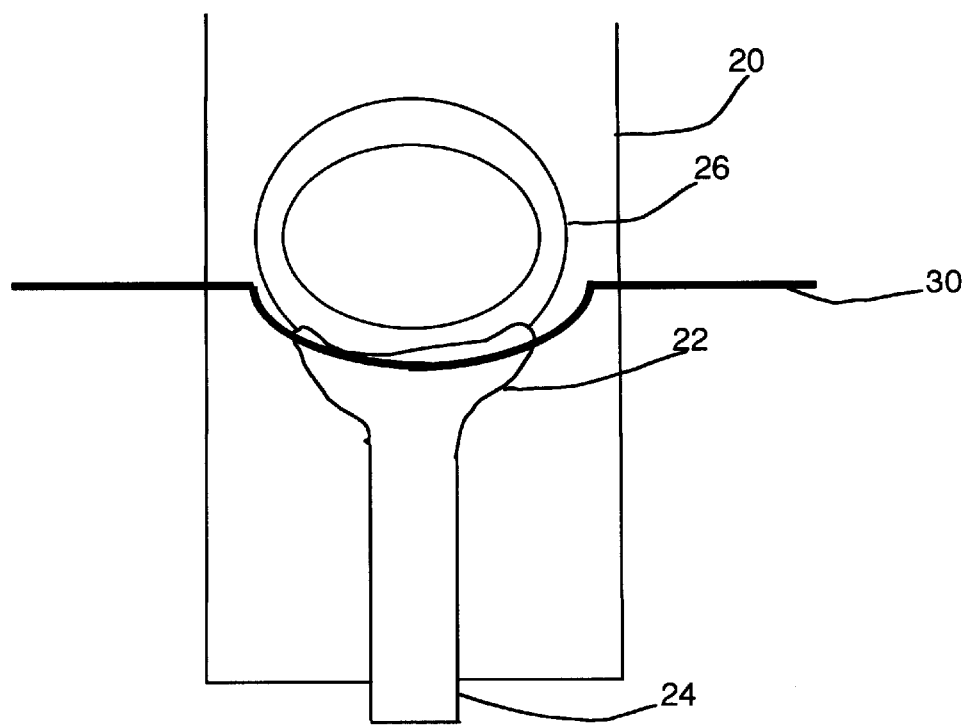
FIG. 3 is a top view of an image of a bonded lead with an artificial boundary according to the method and apparatus of the present invention.

In any of these embodiments, an artificial boundary, 30 is optionally created to guide the boundary tracker. As depicted in FIG. 3, if the edge of indentation 26 is known, an artificial boundary 30 is created around it to serve as a stop for the boundary tracker. This makes the crescent measurement more robust and less susceptible to noise.

Returning now to FIG. 1, at Step D, a boundary tracker is then applied just above where the wire 24 was found, but well below the nominal indentation 26 position using the threshold selected in the previous Step C. If the starting location of the boundary tracker is located on a specularity, the starting location is adjusted up in the direction of the nominal indentation 26 position. The result of applying the boundary tracker of the present invention at that location with the appropriate threshold is a single pixel wide contour around the crescent.

Still in FIG. 1, an angle finder is then applied at Step E to the boundary to obtain the angle of each line segment around the contour of the crescent. These angles are automatically histogrammed as they are calculated and the histogram can be used to find the orientation of the crescent.

Next, at Step F, the angles around the boundary are analyzed to obtain candidate corners. Candidate corners are places around the boundary where the changing angle of each line segment from one segment to the next around the boundary exceeds a user specified threshold and where the absolute orientation of that line segment relative to the standard orientation of the lead is allowed. Candidate corners may denote crescent tips or other significant features of the boundary.

In a preferred embodiment, this comer finder is an advance over previous corner finders known in the art because it can be restricted to work at certain absolute starting orientations. This improvement makes the corner finder run faster and find fewer unwanted corner candidates that would otherwise have to be removed by a subsequent processing step.

Next, at Step G, from the candidate corners along the boundary, the crescent tips are chosen based on their geometric properties. Geometric properties include ordinal location along the boundary, whether the candidate corner is the right-most, left-most, top-most, or bottom-most candidate corner in the list and whether it is located above or below, left or right of the indent center position (if it is known), the crescent base location (if it is known) and the opposite crescent tip (when it is found).

The location of the crescent base can also be obtained from the boundary as that location below the crescent tips where the width of the crescent boundary outline becomes the same as the wire width.

At Step H, in FIG. 1, using the position of the crescent tips the present invention measures the width and height of the crescent. This information as well as the presence or absence of the wire is returned to host controller controlling the wirebonder. Based on these measurements, other steps can be taken to accept or reject the device having this particular bond.

In one preferred embodiment of the present invention, the intermediate image used is the post-bond image shown in FIG. 2, rather than the difference image of FIG. 2c. Using the post-bond image only improves the speed of the entire process, but may lower the accuracy compared to performing the analysis when the difference image is the intermediate image.

As will be apparent to those skilled in the art, greyscale boundary tracking could be used in the present invention instead of binary boundary tracking. Similarly, unrotated images could be used as the intermediate image.

Preferred embodiments of the present invention are implemented in computer programs written in the C programming language for the Cognex Vision Processors, but those skilled in the art know that some or all of the present invention could also be implemented in firmware or gate arrays or circuitry to form part of a wirebonder or similar apparatus. Similarly, the techniques of the present invention can also be applied to machine inspections of other bonded parts having properties similar to those of bonded leads on semiconductor chips.

Those skilled in the art will appreciate that the embodiments described above are illustrative only, and that other systems in the spirit of the teachings herein fall within the scope of the invention.

What is claimed is:

1. An apparatus for finding dimensions of an object in an image, in an image processing system having a binary boundary tracker comprising:

a threshold selection tool for analyzing an element of said object, said element having known dimensions, to obtain a threshold grey value;

said binary boundary tracer coupled to said threshold selection tool for generating signals representative of the coordinates of the boundary of said object using said threshold grey value to self-calibrate; and an angle finder for obtaining angles of selected segments of said boundary of said object and generating histogram data therefrom, said angle finder including a feature analyzer for obtaining candidate corners of said object having changing angles from a first segment to a second segment in excess of an angle threshold, and for analyzing the geometric properties of said candidate corners for correspondence to features being sought so that the dimensions of said candidate corners in said image can be determined, measured and reported to a host controller.

2. The apparatus of claim 1, wherein said threshold selection tool further comprises an artificial boundary creator for providing inputs to said boundary tracker that limit the area said boundary tracker analyzes, including limits that correspond to known dimensions of portions of said object in said image.

3. The apparatus of claim 1, wherein said angle finder further comprises: a corner finder that locates candidate corners of said object as places around the boundary where the changing angle of each line segment from a first segment to a next segment around said boundary exceeds a user specified quantity and where the absolute orientation of said first line segment relative to a standard orientation of an element of said object is within a predetermined amount.

4. The apparatus of claim 1, wherein said image is a difference image created in a wirebonding system by subtracting a pre-bond image of said object from a post-bond image of said object.

5. The apparatus of claim 1, wherein said image is a post-bond image created in a wirebonding system.

6. A method of finding dimensions of an object in an image, in an image processing system having a binary boundary tracker comprising the steps of:

analyzing an element of said object, said element having known dimensions, to obtain a threshold grey value;

applying said binary boundary tracker for generating signals representative of the coordinates of the boundary of said object using said threshold grey value to self-calibrate; and applying an angle finder for obtaining angles of selected segments of said boundary of said object and generating histogram data therefrom, said angle finder including a feature analyzer for obtaining candidate corners of said object having changing angles from a first segment to a second segment in excess of an angle threshold, and for analyzing the geometric properties of said candidate corners for correspondence to features being sought so that the dimensions of said candidate corners in said image can be determined, measured and reported to a host controller.

7. The method of claim 6, wherein said analyzing step comprises:

applying a caliper device for finding and calculating the width of a representative portion of said object; and generating a threshold value derived from said width calculated by said caliper device and transmitting said threshold value to said boundary tracker.

8. The method of claim 7, wherein said step of applying an angle finder further comprises the step of applying a corner finder that locates candidate corners of said object as places around the boundary where the changing angle of each line segment from a first segment to a next segment around said boundary exceeds a user specified quantity and where the absolute orientation of said first line segment relative to a standard orientation of an element of said object is within a predetermined amount.

9. The method of claim 6, wherein said analyzing step comprises:

applying a caliper device for locating the edges of a representative portion of said object; and generating a threshold value using the average grey scale value of pixels at said edges located by said caliper device and transmitting said threshold value to said boundary tracker.

10. The method of claim 6, wherein said analyzing step further comprises creating an artificial boundary for providing inputs to said boundary tracker that limit the area said boundary tracker analyzes, including limits that correspond to known dimensions of portions of said object in said image.

11. The method of claim 6, wherein said image is a difference image created in a wirebonding system by subtracting a pre-bond image of said object from a post-bond image of said object.

12. The method of claim 6, wherein said image is a post-bond image created in a wirebonding system.

* * * * *